US006265934B1

(12) United States Patent
Wood

(10) Patent No.: US 6,265,934 B1
(45) Date of Patent: Jul. 24, 2001

(54) Q-SWITCHED PARAMETRIC CAVITY AMPLIFIER

(75) Inventor: James Richard Wood, Grapevine, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/464,877

(22) Filed: Dec. 16, 1999

(51) Int. Cl.⁷ .............................. H03F 7/00; H03F 7/06; H01P 1/00
(52) U.S. Cl. ............................ 330/4.5; 330/4.6; 330/4.9; 333/218
(58) Field of Search ............................ 330/4.5, 4.6, 4.7, 330/4.8, 4.9; 333/218

(56) References Cited

U.S. PATENT DOCUMENTS

| | | | |
|---|---|---|---|
| 3,290,619 | 12/1966 | Geusic et al. | 332/7.51 |
| 3,379,956 | 4/1968 | Battles et al. | 321/69 |
| 3,617,764 | * 11/1971 | Patel | 330/4.5 |
| 3,628,186 | * 12/1971 | Ashkin | 330/4.5 |
| 3,631,331 | 12/1971 | Fairley et al. | 321/69 |
| 3,742,335 | 6/1973 | Konishi | 321/69 |
| 3,772,528 | * 11/1973 | Anderson | 330/4.5 |
| 3,944,950 | 3/1976 | Jacobs et al. | 333/31 |
| 3,963,977 | 6/1976 | Mitsui | 321/69 |
| 4,527,137 | 7/1985 | Hartley | 333/137 |

(List continued on next page.)

OTHER PUBLICATIONS

Stephan Ohr, "Darpa Sows Seeds of a Telecom Revolution," *EE Times,* Aug. 4, 1997, p. 1.

F.M. Mueller, et al, "HTS Microwave Cavity with Temperature–Independent Frequencies," *IEEE Transactions on Applied Superconductivity,* vol. 5, No. 2, Jun. 1995, pp 1983–1986.

C.J. Maggiore, et al, "Low–loss Microwave Cavity Using Layered–dielectric Materials," Appl. Phys. Lett 64 (11) Mar. 14, 1994.

E. Yablonovitch, "Photonic Band–gap Structures," Journal of the Optical Society of America Bulletin, vol. 10, No. 2, Feb. 1993, pp 283–295.

Henry Q. Everitt, "Applications of Photonic Band Gap Structures," *Optics and Photonics News,* Nov. 1992, pp 20–23.

"Application Notes for Bulk Window™ Waveguide Switch Elements," M/A Com Semiconductor Products Operation, Burlington, MA 01803, pp 3–3 through 3–8.

N.C. Luhmann, Jr., High Power, High Efficiency, Monolithic Quasi–Optical Frequency Triplers Using Microwave Power Module Drivers, Feb. 27, 1996.

(List continued on next page.)

*Primary Examiner*—Robert Pascal
*Assistant Examiner*—Patricia T. Nguyen
(74) *Attorney, Agent, or Firm*—Sidley & Austin; Stephen S. Sadacca

(57) ABSTRACT

A Q-switched parametric cavity microwave amplifier has input and output ports for receiving an input signal and producing a switched amplified output signal. A pump signal, preferably at a harmonic of the input signal, is received through a pump signal port and provided to a pump signal cavity within a housing. The pump signal interacts with a non-linear medium to produce carriers. A frequency selective layer reflects the pump signal but permits the input signal to pass therethrough. The input signal interacts with the carriers produced in the non-linear medium to enhance the signal present within the resonant cavity for the input signal. This transfers energy from the pump signal to the lower frequency input signal. A Q-switch is positioned in series with the output waveguide to cause energy to be stored within the input signal cavity. When the Q-switch is opened, a pulse is produced representing an amplified version of the input signal.

17 Claims, 2 Drawing Sheets

U.S. PATENT DOCUMENTS

| | | | |
|---|---|---|---|
| 4,595,892 | 6/1986 | Martinetti et al. | 333/218 |
| 4,636,758 | 1/1987 | Mettoudi | 333/218 |
| 4,712,121 | 12/1987 | Yokoyama | 357/4 |
| 4,782,222 | 11/1988 | Ragle et al. | 250/211 |
| 4,996,505 | 2/1991 | Keilmann | 333/218 |
| 5,278,427 | 1/1994 | Choi | 257/17 |
| 5,422,613 | 6/1995 | Nativ | 333/218 |
| 5,731,752 | 3/1998 | Wood | 333/218 |
| 5,796,314 | 8/1998 | Tantawi et al. | 333/20 |
| 5,796,902 * | 8/1998 | Bhat et al. | 385/122 |
| 5,880,921 | 3/1999 | Tham et al. | 361/233 |

OTHER PUBLICATIONS

Joy Yi–Yin Liao, "Frequency Multipliers for Millimeter Wave Applications," *Riken Review*, No. 11, Dec. 1995, pp5–6.

J. Grenzer, et al, "Frequency Multiplication of Microwave Radiation in a Semiconductor Superlattice by Electrons Capable to Perform Bloch Oscillations," *Annalen der Physik*, Apr. 1995, pp 265–271.

K.N. Ostricov, et al, "Resonant Second Harmonics Generation of the Submillimeter Surface Wave in the Semiconductor Superlattice Bounded by a Metal," IEEE Antennas and Propagation Society Int'l Symposium, 1995 Digest, vol. I, pp 742–45.

D. Lippens, "Quantum Well Devices for Millimetre Wave Applications," $23^{rd}$ European Microwave Conference, Madrid, Spain, Sep. 1993, pp 61–66.

M. Hadjazi, et al "60 GHz Reflection Gain Based on Superlattice Negative Differential Conductance," *Electronics Letters*, Apr. 15, 1993, vol. 29, No. 8.

Wen–Shiung Lour, "Multi–state Superlattice–Emitter Resonant–Tunneling Bipolar Transistor with Circuit Applications," *Superlattices and Microstructures*, 1993, Academic Press Ltd., pp 81–86.

Federico Capasso, "Quantum Effect Devices: Physics and Applications," edited by Anastassakis & Joannopoulos, $20^{th}$ International Conference on The Physics of Semiconductor, Aug. 1990, pp 379–386.

A.Y. Cho, "Current State and Future Challenge in Molecular Beam Epitaxy (MBE) Research," Molecular Beam Epitaxy 1988, Sapporo, Japan, Reprinted from *Journal of Crystal Growth*, 95 (1989) Nos. 104, pp 1–10.

Tohru Takada et al, "Frequency Triplers and Quadruplers with GaAs Schottky–Barrier Diodes at 450 and 600 GHz," IEEE Transactions on Microwave Theory and Techniques, vol MTT–27, No. 5, May 1979, pp 519–523.

L.A. Blackwell et al, "Semiconductor–Diode Parametric Amplifiers," Prentice–Hall Inc., 1961, pp 57–60 and 101–121.

* cited by examiner

Q-SWITCHED PARAMETRIC CAVITY AMPLIFIER

BACKGROUND OF THE INVENTION

In certain applications, it is difficult to obtain required microwave energy signals because of restrictions in energy sources, weight and the available volume for such equipment. Such limitations are frequently present in applications involving microwave equipment used in missiles, airplanes, and satellites. In general, it is more difficult to produce microwave signals as the frequency of the required signal increases. One method for producing a high frequency signal is to use a multiplier device such as shown in U.S. Pat. No. 5,731,752 entitled "Microwave Signal Frequency Multiplier." Certain microwave signals are continuous and others are switched, which are typically used for producing pulses.

There exists a need for a switched, microwave amplifier which can store energy from an available microwave source and selectively release this energy as pulses when required.

SUMMARY OF THE INVENTION

A selected embodiment of the present invention is a switched microwave amplifier which includes a housing having an interior cavity. An input port is connected to the housing for providing an input signal to the interior cavity of the housing. An output port is connected to the housing for conveying an output signal from the amplifier. A pump signal port is connected to the housing for coupling a pump signal to the interior cavity of the housing. The interior cavity comprises a first cavity that is resonant with the input signal and the output signal. A non-linear medium is positioned within the first cavity for producing carriers therein in response to the pump signal. A frequency selective barrier within the interior cavity substantially reflects the pump signal and substantially transmits the input signal. The frequency selective barrier defines a pump signal resonant cavity within the housing interior cavity. An output signal is produced within the first cavity as a result of interaction of the input signal and the liberated carriers. The output signal is at the frequency of the input signal and has a greater amplitude than the input signal. A two-state switch is coupled in series with the output port wherein the switch has a first state for blocking transfer of stored energy from the first cavity and has a second state to permit release of the stored energy from the first cavity through the output port.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

Figure 1:
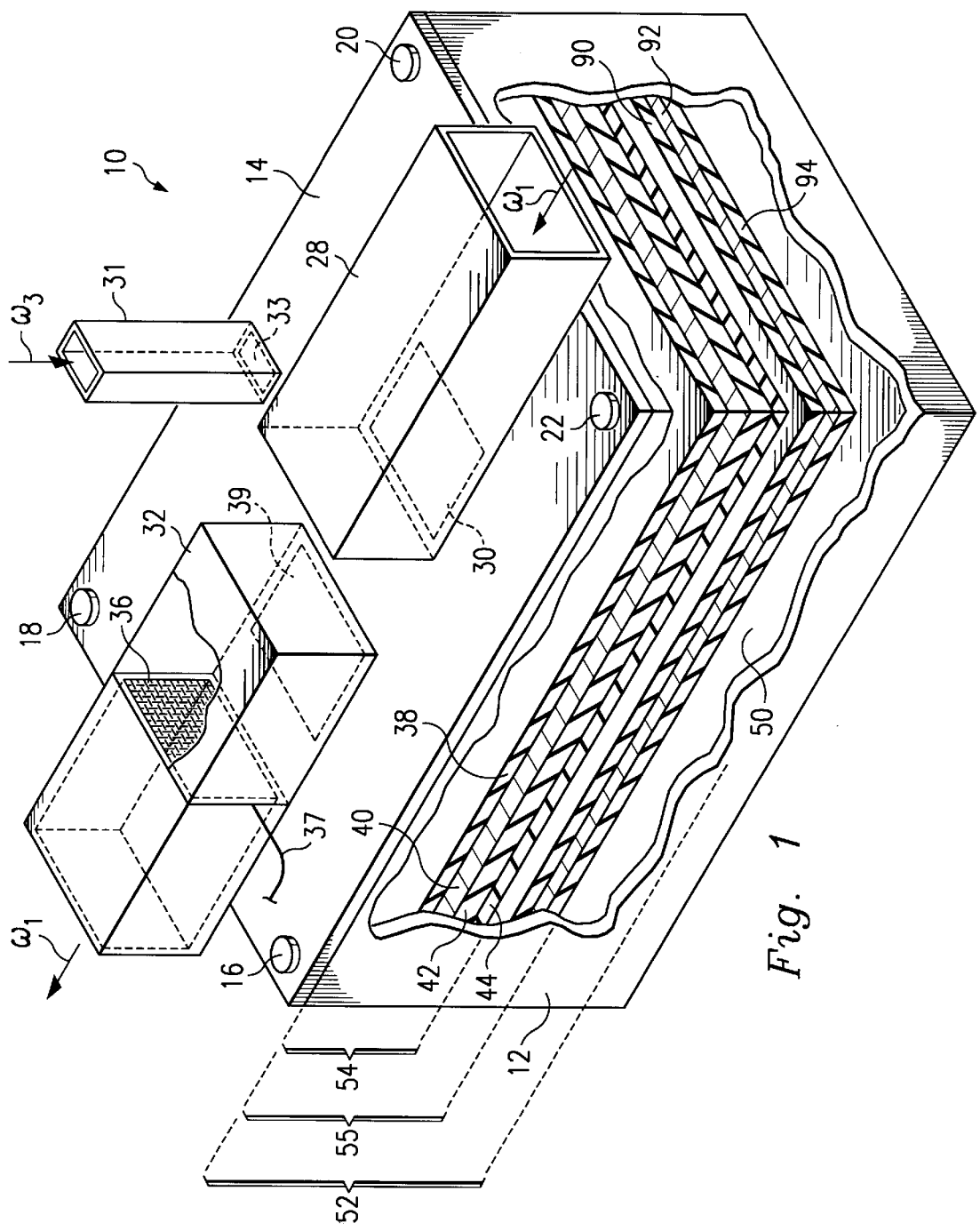
FIG. 1 is a perspective, partially cut away view of a Q-switched frequency multiplier in accordance with the present invention.

A switched parametric amplifier 10 in accordance with the present invention is illustrated in FIG. 1. The amplifier 10 receives an input signal $\omega_1$. Within the amplifier 10, the input signal is amplified to produce an output signal $\omega_1$. The amplifier 10 includes a Q-switch which causes a build-up of energy from the input signal and a pump signal and selectively releases this energy as a switched, amplified output signal.

The amplifier 10 includes a lower housing 12 and a top plate 14 which is secured to the housing 12 by means of screws 16, 18, 20, and 22. The housing 12 and plate 14 are preferably made of brass, aluminum, or plated dielectric material.

The input signal $\omega_1$ is provided to the amplifier 10 through an input wave guide 28 which is secured to the top plate 14. The input microwave signal $\omega_1$ is transferred through an opening 30 in the plate 14 to the interior of the housing 12. The amplifier 10 includes an output wave guide 32 which is mounted on the plate 14 and receives microwave signal energy via an opening 39 in the plate 14. A Q-switch 36 is mounted within the wave guide 32 and functions to either block or pass the output signal $\omega_1$. The Q-switch 36 receives a control signal via a line 37 to selectively turn the switch 36 on and off.

Within the housing 12 there is provided a grid structure comprising a plurality of layers of materials. At the top of the grid there is provided a non-linear layer 38. Immediately below the non-linear layer 38 there are provided temperature compensation dielectric layers 40 and 42. Immediately below the layer 42 there is provided a frequency selective layer 44.

The dimensions illustrated in FIG. 1 are for illustrative purposes and are not necessarily in proportion to that which is shown. Actual dimensions are primarily a function of the signal frequencies which are used.

The interior of the housing 12 has a surface 50 which is reflective to the microwave energy present within the amplifier 10.

A pump signal $\omega_3$ is transmitted through a waveguide 31 and an opening 33 to the interior of the amplifier 10.

The region within the housing 12 between the lower surface of the plate 14 and the surface 50 comprises a pump signal cavity 52 which is tuned to the frequency of the input signal $\omega_1$. The region within the housing 12 between the lower surface of the plate 14 and the frequency selective layer 44 comprises a harmonic signal cavity 54 which is tuned to the frequency of the pump signal $\omega_3$.

The region in the amplifier 10 between the lower surface of plate 14 and the frequency selective layer 94 comprises an idler cavity 55 which is tuned to the frequency of the signal $\omega_2$.

The Q-switch 36 can be fabricated as any one of the following:

(A) PIN diode switch, as described in Application Notes for Bulk Window™ waveguide switch elements, pages 3—3 through 3–8, M/A Com Semiconductor Products Operation, Burlington, Mass. 01803.

(B) Micro-Electro-Mechanical Switches (MEMS) as described in U.S. Pat. No. 5,880,921 by Tham, et al. which issued Mar. 9, 1999 and is entitled "Monolithically Integrated Switched Capacitor Bank Using Micro Electro Mechanical System (MEMS) Technology." A further description of this type of switch is given in an article "DARPA Sows Seeds of a Telecom Revolution," EE Times, Monday, Aug. 4, 1997, starting on page 1.

(C) Laser diode switched photoconductive materials/ window as described in U.S. Pat. No. 5,796,314 to Tantawi, et al. entitled "Active High-Power RF Switch And Pulse Compression System."

(D) Bulk avalanche semiconductor switch (BASS) as described in U.S. Pat. No. 4,782,222 to Ragle, et al. entitled "Bulk Avalanche Semiconductor Switch Using Partial Light Penetration And Inducing Field Compression."

(E) A latching circulator such as Model OP320 sold by Channel Microwave Corporation, 480 Constitution Avenue, Camarillo, Calif. 93012.

The non-linear material 38 is preferably a doped superlattice which comprises a photonic band gap structure. Such structures are described in "Photonic Band-Gap Structures" by E. Yablonovitch in *Journal of The Optical Society of America Bulletin*, Volume 10, No. 2, Feb. 1993, pp. 283–295. As described in the article, the dimensions of the material are a function of the operating frequency. An applicable photonic band gap structure is further described in "Applications of Photonic Band Gap Structures" by Henry O. Everitt in *Optics and Photonics News*, Nov. 1992, pp.20–23.

The temperature compensation dielectric layers 40 and 42 are preferably dielectric layers chosen for their dielectric property behavior over frequency and thickness, so as to achieve a given level of volume fill to achieve temperature compensated device operation. This technique is described in HTS Microwave Cavity with Temperature Independent Frequencies by Mueller, et al. in IEEE Transactions on Applied Superconductivity, Vol. 5, No. 2, June 1995, pp. 1983–1986.

The temperature compensation dielectric layers may exist separately from, or form part or all of the frequency selective layer 44.

The frequency selective layer 44 is preferably implemented as described in "Low-Loss Microwave Cavity using Layered-Dielectric Materials" by C. J.

Maggiore, et al. in *Appl. Phys. Lett.* 64(11), Mar. 14, 1994, starting at p. 1451.
The material described in this paper is a superlattice.

The amplifier 10 is shown in FIG. 1 with a square configuration which in a selected embodiment can have side dimensions of approximately one (1) inch and a thickness of approximately 0.25 inch. However, it can have other shapes, such as rectangular or round, with the size primarily depending upon the necessary sizes required for the tuned cavities 52, 54 and 55.

The amplifier 10 includes a second group of layers 90, 92, and 94 which are offset by a gap below the layers 38, 40, 42, and 44. The layers 90 and 92 are temperature compensation dielectric layers corresponding to the previously described dielectric layers 40 and 42. The layer 94 is a frequency selective layer that corresponds to frequency selective layer 44. However, layer 94 has a different cut-off frequency. The frequency selective layer 94 is transparent to the input signal $\omega_1$, but is reflective for an intermediate frequency signal $\omega_2$, which is at a greater frequency than $\omega_1$, but a lesser frequency than $\omega_3$. For example, the signal $\omega_3$ can be three times the frequency of signal $\omega_1$ and signal $\omega_2$ can be twice the frequency of signal $\omega_1$.

U.S. Pat. No. 5,731,752 entitled "Microwave Signal Frequency Multiplier which issued Mar. 24, 1998 is incorporated by reference herein. The structures shown in this patent may be utilized as a part of the present invention.

In operation, the switch 36 is placed in a first state to block the transfer of energy from the amplifier 10 while input energy in the form of signal $\omega_3$ is received. This energy is transferred to the cavity 54, but as the pump signal $\omega_3$ passes through the non-linear layer 38, carriers are generated which interact with and become a part of the input signal $\omega_1$. The energy of the pump signal $\omega_3$ is transferred to the cavity 52 for the signal $\omega_1$. The frequency selective layer 44 is transparent to the input signal $\omega_1$, the lower microwave frequency, but is reflective to the harmonic microwave pump signal $\omega_3$ which is at a substantially higher microwave frequency. Thus, the energy of the signal at the frequency of $\omega_3$ is transferred to the cavity 52, and the energy level of signal $\omega_1$ is increased by the power derived from the pump signal $\omega_3$.

When the Q-switch 36 is switched to its second state and becomes transparent to the signal $\omega_1$, the energy within the cavity 52 is transferred through the opening 39, the switch 36 and out through the wave guide 32 as signal $\omega_1$. In blocking the output signal by use of the switch 36, energy from the pump signal $\omega_3$ can be stored as energy in cavity 52 to produce a high energy pulse of the input signal $\omega_1$ upon opening the switch 36. The output signal $\omega_1$ is a pulsed signal which is an amplified signal of the input signal $\omega_1$.

Figure 2:
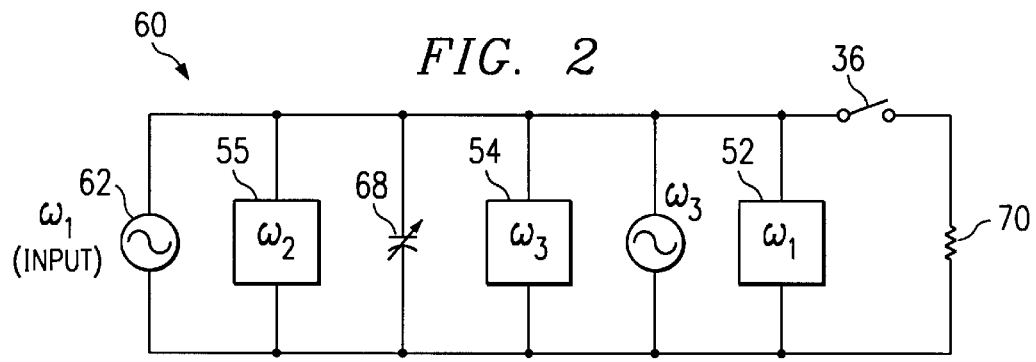
FIG. 2 is a schematic diagram of the multiplier shown in FIG. 1.

An electrical schematic circuit 60 is shown in FIG. 2 for illustrating the operation of the amplifier 10 shown in FIG. 1. Elements that are common to FIGS. 1 and 2 carry the same reference numerals. A source 62 indicates a generator for the input signal $\omega_1$. A variable capacitor 68 represents the nonlinear layer 38. The cavities 52, 54 and 55 shown in FIG. 2 correspond to the similarly numbered cavities shown in FIG. 10. The switch 36 shown in FIG. 2 corresponds to the Q-switch 36 shown in FIG. 1.

In operation, the pump signal $\omega_3$ is provided through waveguide 31 into cavity 54 where the energy of this signal interacts with the nonlinear layer 38 to produce liberated carriers in this layer. The input signal $\omega_1$ is provided through waveguide 28 to the cavity 52. When the signal $\omega_1$ encounters the free carriers in the layer 38, many of these carriers are swept along with the signal $\omega_1$ thereby transferring energy for this signal to cavity 52. The signal $\omega_3$ is preferably a harmonic of signal $\omega_1$. The energy of the pump signal $\omega_3$ is transferred to the cavity $\omega_1$ to enhance the amplitude of the A signal.

The Q-switch 36 blocks the release of energy from the cavity 52 thereby 10 causing energy to be built up in this cavity during the time that the switch is closed. When the state of the switch 36 is changed to conductive for signal $\omega_1$, the energy from cavity 52 is released as an output signal through the output waveguide 32. The output signal $\omega_1$ is at the same frequency as the input signal $\omega_1$.

The frequency selective layer 94 defines the intermediate cavity 55 which stores energy of an intermediate signal $\omega_2$. The signal $\omega_2$ and cavity 55 function as a transfer stage for moving energy from the pump cavity 54 to the cavity 52 for signal $\omega_1$.

Figure 3:
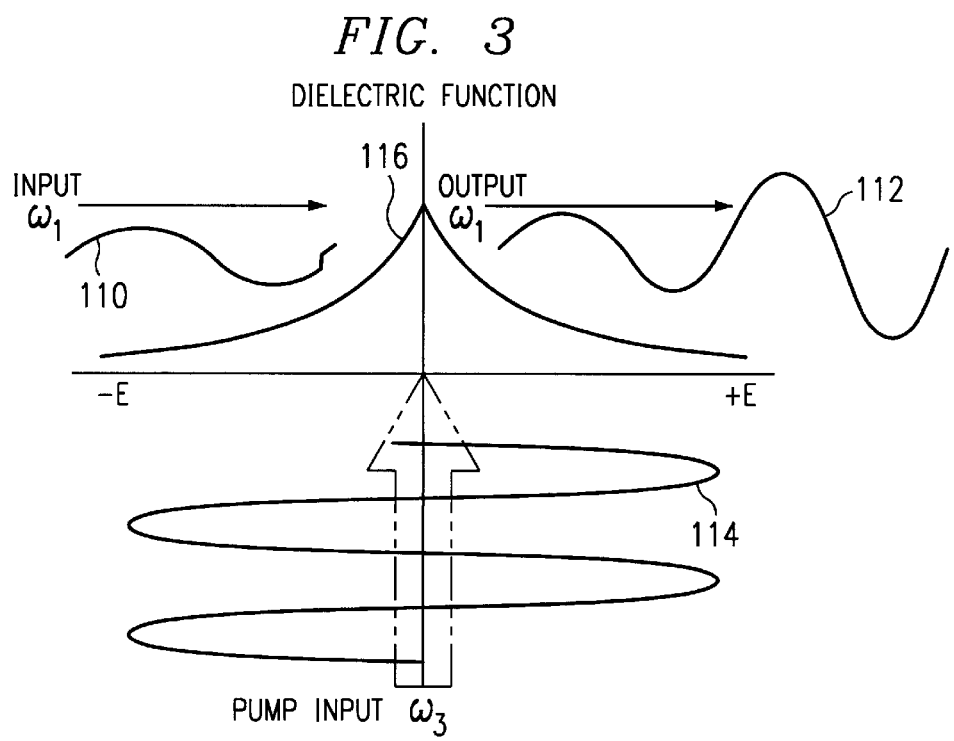
FIG. 3 is a chart illustrating the signal production of the multiplier shown in FIG. 1, and FIGS. 4A and 4B are waveforms which contrast operations with and without the Q-switch of the present invention.

The relationship of the signals used in the amplifier 10 are shown in FIG. 3. Waveform 110 represents the input signal $\omega_1$. The waveform 112 represents the output signal of $\omega_1$. The pump signal $\omega_3$ is represented by the waveform 114. The transfer function of the amplifier 10 as primarily provided by the nonlinear layer 38 is shown by curve 116.

Figure 4A:
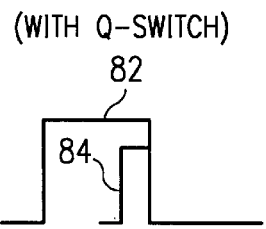
Figure 4B:
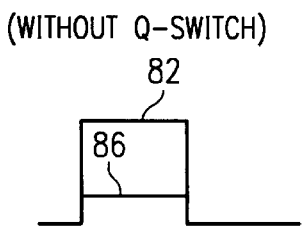

FIGS. 4A and 4B represent a comparison of operation of the amplifier with and without the use of the Q-switch 36. FIG. 4A represents the above described operation. Waveform 82 represents the pump signal $\omega_3$, such as a pulsed radar signal. Waveform 84 represents a pulse of the output signal $\omega_1$. The switch is turned off at the start of the waveform 82 and is opened at the start of waveform 84. In contrast, as shown in FIG. 4B, waveform 86 represents the output signal $\omega_1$ without use of the switch 36. The waveform 84 shows a higher peak energy than that present for waveform 86. Thus, the switch 36 functions to store energy from the pump signal during the time between the start of the pulses 82 and 84, and releases this energy as a pulse of signal $\omega_1$ as shown by waveform 84.

Although only one embodiment of the invention has been illustrated in the accompanying drawings and described in the foregoing Detailed Description, it will be understood that the invention is not limited to the embodiments disclosed, but is capable of numerous rearrangements, modifications and substitutions without departing from the scope of the invention.

What is claimed is:

1. A switched microwave amplifier, comprising:
    a housing having an interior cavity,
    an input port connected to said housing for providing an input signal to said interior cavity of said housing,
    an output port connected to said housing for conveying an output signal from said amplifier,
    a pump signal port connected to said housing for coupling a pump signal to said interior cavity of said housing,
    said interior cavity comprising a first cavity which is resonant for said input signal and said output signal,
    a nonlinear medium within said first cavity for producing carriers therein in response to said pump signal,
    a frequency selective barrier within said interior cavity, said frequency selective barrier substantially reflective to said pump signal and substantially transparent to said input signal, wherein said frequency selective barrier defines a pump signal resonant cavity within said housing interior cavity,
    wherein an output signal is produced within said first cavity as a result of interaction of said input signal and said carriers, and wherein said output signal is at the frequency of said input signal and has a greater amplitude than said input signal, and
    a two-state switch coupled in series with said output port, wherein said switch has a first state for blocking transfer of stored energy from said first cavity and having a second state to permit release of said stored energy from said first cavity through said output port.

2. A switched microwave amplifier as recited in claim 1 wherein said input port and said output port are waveguides.

3. A switched microwave amplifier as recited in claim 2 wherein said waveguides are positioned on a common surface of said housing.

4. A switched microwave amplifier as recited in claim 1 wherein said pump signal is a harmonic of said input signal.

5. A switched microwave amplifier as recited in claim 1 wherein said non-linear medium and said frequency selective barrier are each planar members.

6. A switched microwave amplifier as recited in claim 1 including at least one temperature compensation dielectric layer proximate said non-linear medium.

7. A switched microwave amplifier as recited in claim 1 including a second frequency selective barrier which is substantially reflective to an intermediate frequency signal and is substantially transparent to said input signal and which defines an intermediate frequency cavity within said housing, said intermediate frequency cavity tuned to an intermediate frequency which is between the frequencies of said input signal and said pump signal.

8. A switched microwave amplifier as recited in claim 7 including at least one temperature compensation dielectric layer proximate said second frequency selective barrier.

9. A switched microwave amplifier as recited in claim 7 wherein said intermediate frequency signal and said pump signal are harmonics of said input signal.

10. A switched microwave amplifier, comprising:
    a housing having an interior cavity,
    an input port connected to said housing for providing an input signal to said interior cavity of said housing,
    an output port connected to said housing for conveying an output signal from said amplifier,
    a pump signal port connected to said housing for coupling a pump signal to said interior cavity of said housing,
    said interior cavity comprising a first cavity which is resonant for said input signal and said output signal,
    a planar nonlinear medium within said housing cavity for producing carriers therein in response to said pump signal,
    a first planar frequency selective barrier within said interior cavity, said frequency selective barrier substantially reflective to said pump signal and substantially transparent to said input signal, wherein said frequency selective barrier defines a pump signal resonant cavity within said housing interior cavity,
    at least one temperature compensation dielectric layer between said nonlinear medium and said first frequency selective barrier,
    a second frequency selective barrier which is substantially reflective to an intermediate frequency signal and is substantially transparent to said input signal and which defines an intermediate frequency cavity within said housing, said intermediate frequency cavity tuned to said intermediate frequency signal which has a frequency between the frequencies of said input signal and said pump signal,
    at least one temperature compensation dielectric layer adjacent said first frequency selective barrier,
    wherein an output signal is produced within said interior cavity as a result of interaction of said input signal and said carriers, and wherein said output signal is at the frequency of said input signal and has a greater amplitude than said input signal, and
    a two-state switch coupled in series with said output port, wherein said switch has a first state for blocking transfer of stored energy from said first cavity and having a second state to permit release of said stored energy from said first cavity through said output port.

11. A switched microwave amplifier as recited in claim 10 wherein said input port and said output port are mounted on a common surface of said housing.

12. A switched microwave amplifier as recited in claim 10 wherein there are two of said temperature compensation layers between said nonlinear medium and said first frequency selective barrier.

13. A switched microwave amplifier as recited in claim 10 wherein there are two temperature compensation layers adjacent said second frequency selective barrier.

14. A method of operation for a switched microwave amplifier, comprising the steps of:
    receiving an input signal via an input port to a first cavity which is resonant with said input signal,
    receiving a pump signal via a pump signal port to a pump cavity which is within said first cavity and is tuned to resonant with said pump signal,
    providing said pump signal to a non-linear medium within said pump cavity to produce carriers within said non-linear medium,
    transferring energy associated with said carriers by interaction of said input signal with said carriers to store energy in said first cavity during the time that a switch which is coupled in series with said output port is in a first state, and releasing said stored energy from said first cavity through said output port when said switch is changed to a second state.

15. A method of operation for a parametric amplifier as recited in claim 14 including the step of producing an intermediate signal derived from said pump signal in a third resonant cavity in said housing, said third cavity having a resonant frequency between the frequencies of said input signal and said pump signal.

16. A method of operation for a parametric amplifier as recited in claim 15 wherein said pump signal is a harmonic of said input signal and said intermediate signal is a harmonic of said input signal.

17. A method of operation for a parametric amplifier as recited in claim 14 wherein said pump signal is a harmonic of said input signal.

* * * * *